US007295062B2

(12) United States Patent
Fenger

(10) Patent No.: US 7,295,062 B2
(45) Date of Patent: Nov. 13, 2007

(54) PULSE MODULATED POWER CONVERTER

(75) Inventor: Lars Michael Fenger, Glostrup (DK)

(73) Assignee: Bang & Olufsen Icepower A/S, Lyngby (DK)

(*) Notice: Subject to any disclaimer, the term of this patent is extended or adjusted under 35 U.S.C. 154(b) by 132 days.

(21) Appl. No.: 10/534,026

(22) PCT Filed: Nov. 14, 2003

(86) PCT No.: PCT/IB03/06318
§ 371 (c)(1),
(2), (4) Date: Jan. 30, 2006

(87) PCT Pub. No.: WO2004/047286
PCT Pub. Date: Jun. 3, 2004

(65) Prior Publication Data
US 2006/0152277 A1 Jul. 13, 2006

(30) Foreign Application Priority Data
Nov. 15, 2002 (SE) .................................. 0203403

(51) Int. Cl.
*H03F 3/38* (2006.01)
(52) U.S. Cl. .................... 330/10; 330/107; 330/251; 363/41; 307/151
(58) Field of Classification Search .................. 330/10, 330/107, 251, 207 A; 363/41; 307/151
See application file for complete search history.

(56) References Cited

U.S. PATENT DOCUMENTS

| | | | | |
|---|---|---|---|---|
| 5,347,442 A | * | 9/1994 | Henmi et al. .................. 363/41 |
| 5,352,986 A | * | 10/1994 | Modgil et al. ................. 330/10 |
| 5,510,753 A | * | 4/1996 | French ........................ 330/146 |
| 6,297,692 B1 | * | 10/2001 | Nielsen ........................ 330/10 |
| 6,392,476 B1 | * | 5/2002 | Rodriguez .................... 330/10 |
| 6,441,685 B1 | | 8/2002 | MacMillan | |
| 7,247,955 B2 | * | 7/2007 | Tracy et al. ................. 307/151 |
| 2002/0070799 A1 | | 6/2002 | Dahan et al. | |

OTHER PUBLICATIONS

International Search Report.

* cited by examiner

Primary Examiner—Patricia Nguyen
(74) Attorney, Agent, or Firm—Harness, Dickey & Pierce, P.L.C.

(57) ABSTRACT

A pulse modulation power converter comprising a forward path including a forward block (15), a switching stage (11) for amplifying an output from the forward block, and an output filter (12) for low pass filtering an output signal from the switching stage, a global feedback path (13), connected to the low pass filtered output signal, comprising a global feedback block (18, 19) for generating a feedback signal, and means (14) for subtracting said feedback signal from an input signal, and feeding the result to said forward path. The global feedback block and/or forward block includes means for compensating at least a portion of a phase lag of said output filter, and means for obtaining a 180 degrees phase lag at a switching frequency, thereby achieving conditions for a controlled oscillation at said switching frequency. The control system combines the advantages of the self-oscillation technology with a high gain, wide-band control loop for suppressing non-linearities. This will lead to a better performing system in terms of total harmonic distortion and noise.

9 Claims, 5 Drawing Sheets

PULSE MODULATED POWER CONVERTER

TECHNICAL FIELD

This invention relates to a pulse modulation converter comprising a forward path including a forward block, a switching stage for amplifying an output from the forward block, and an output filter for low pass filtering an output signal from the switching stage, a global feedback path, connected to the low pass filtered output signal, comprising a global feedback block for generating a feedback signal, means for subtracting the feedback signal from an input signal, and feeding the result to the forward path.

The invention also relates to a switching power conversion system, such as DC-AC (e.g. audio amplification), DC-DC or AC-AC conversion systems or any combination of the above mentioned comprising such a modulator system. The invention may advantageously be used for improved power conversion in any system, in particular precision DC-AC conversion systems such as high efficiency audio amplification or line drivers.

TECHNICAL BACKGROUND

The pulse width modulator is a central element of any power conversion system. Most switching power converters are based on Pulse Width Modulation (PWM) as means to control efficient conversion between domains (DC or AC).

A typical power converter may include a PWM modulator, a switching power conversion stage, a filter and a control system. A prior art system of this type is described in U.S. Pat. No. 4,724,396 and by Mr. Attwood in Journal of the AES, November 1983. p. 842-853. However, PWM has a range of shortcomings also well known to the art, mainly due to the implementation of the carrier generation. This limits the system bandwidth and complicates design. Also, a stabile and robust control system design is difficult to implement.

In order to overcome these drawbacks, a non-hysteresis self-oscillating modulator (COM) was introduced in the applicant's international patent application WO 98/19391, and is illustrated in FIG. 1. Such a self-oscillating modulator eliminates the need of a carrier generator, with a range of advantages, described in detail in said document. The COM is implemented by two high frequency poles in the control loop 1 feeding back the signal from the power stage 2 to at least one summation point 3 in the converter. This local feedback loop 1 will therefore have a high gain and a high bandwidth.

A problem with this design is that the output filter of the switching power converter becomes more sensitive to load changes thus creating a dynamically unstable system. Due to the high sensitivity of the output filter loading, the system becomes unstable when a large load-step occurs, e.g. when the load is removed. This has required the use of e.g. a Zobel network in order to obtain damping of the output filter in low impedance loading situations.

In the case of multi loop systems, a global loop is defined as a loop 4 feeding back the output of the output filter 5 in the switching power converter. Such a global loop is limited when it comes to open loop gain and bandwidth, in order to avoid double oscillation. The limited feedback gain causes the output filter 5 of the switching power converter to have less compensation for filter non-linearities, thereby compromising the whole system performance.

Further, the structure of a multi-loop system with a modulator implemented in the local loop can be complex due to high order systems which will comprise many poles and zeroes in order to get the right open global loop characteristics.

OBJECTS OF THE INVENTION

Accordingly, a first object of the invention is to provide a superior modulation technique in switching power conversion systems that overcomes fundamental problems related to distortion in prior art techniques thus lowering the total harmonic distortion of the switching power converter.

A second object of the invention is to provide a more stable and robust control and modulator system, thereby obtaining a load invariant switching power converter.

A third object of the invention is to provide a non-complex system thereby lowering cost.

A fourth object of the invention is to reduce the need for output filter control by means of e.g. Zobel networks.

SUMMARY OF THE INVENTION

These and other objects are achieved by a converter of the kind mentioned by way of introduction, wherein the forward block and/or the global feedback block include means for compensating at least a portion of a phase lag of said output filter, and means for obtaining a 180 degrees phase lag at a switching frequency, so that conditions are met for a controlled oscillation at said switching frequency. This novel control concept will be referred to as a Global loop Controlled Oscillation Modulator (GCOM).

According to the invention, a self oscillating modulator is realized by non-hysteresis means in the global loop (including the global feedback path and the forward path of the converter) of a control system structure, which can comprise one or several feedback loops. The converter compensates at least a portion of the phase-lag of the output filter, so that the contribution to the open global loop phase lag from the output filter and the compensation means is less than 180 degrees. Apart from this phase lag, an additional phase lag is implemented at the switching frequency, and this in combination results in self oscillating conditions. The modulator oscillation signal will provide means for PWM generation in the forward path.

The system can in all forms of implementation synthesize a non-costly system.

According to the invention, the global loop will have very high open-loop gain bandwidth levels. The GCOM control system thus combines the advantages of the self-oscillation technology with a high gain, wide-band control loop for suppressing non-linearities. This will lead to a better performing system in terms of total harmonic distortion and noise.

It will also provide for compensation of filter-peaking when stepping the load, thus obtaining a dynamic stable system, invariant of the loading. This is of special importance if the load driven by the switching power converter has a frequency dependant impedance.

The GCOM control system further enables the converter to operate with a reduced or eliminated Zobel network. This leads to a more cost and energy efficient system, since the Zobel components usually are bulky and expensive due to the power dissipation in these components.

The design is an improvement over previous COM technology, where the oscillation was created in the local loop, and the global loop therefore could not present high gain bandwidth.

The compensation means can preferably include a number of zeroes at, or at least near, the output filter cut-off frequency. If the output filter is of order N, at least N−1 zeroes can thus be placed in the global loop, to cancel a portion of the output filter phase lag.

The means for obtaining a 180 degrees phase lag at the switching frequency can include two high frequency poles or time delays, or a combination thereof. These poles and/or time delays are the major reason for causing the self oscillation.

The converter can further include at least one local feedback path from the output of the switching power stage to at least one summation point in the forward path.

If a local loop is implemented, the compensation means may include a number of poles near the output filter cut-off frequency placed in the local feedback path. These poles will have the same effect as zeroes placed in the global loop.

The converter may also include at least one additional global feedback path, connected to the output of the output filter and to a summing point preceding the forward block. This creates additional global control loops, further improving the system performance, e.g. suppression of non-linearities.

The GCOM converter can be implemented in a switching power converter such as a switching power amplifier. The amplifier will have a performance in terms of THD+n that are many times better than what it seen from prior art systems, making the control system very suitable for audio power converters.

The GCOM converter according to the invention is very suitable in all types of precision DC-AC conversion applications such as audio amplification and motor or electrodynamic transducer drive applications. The GCOM converter can also advantageously be used in precision voltage or current controlled DC-AC conversion as e.g. power amplifiers for audio use or line drivers for line transmission.

BRIEF DESCRIPTION OF THE DRAWINGS

These and further aspects of the invention will be further described in the following, with reference to the appended drawings showing presently preferred embodiments of the invention.

DETAILED DESCRIPTION OF THE PREFERRED EMBODIMENTS

Figure 1:
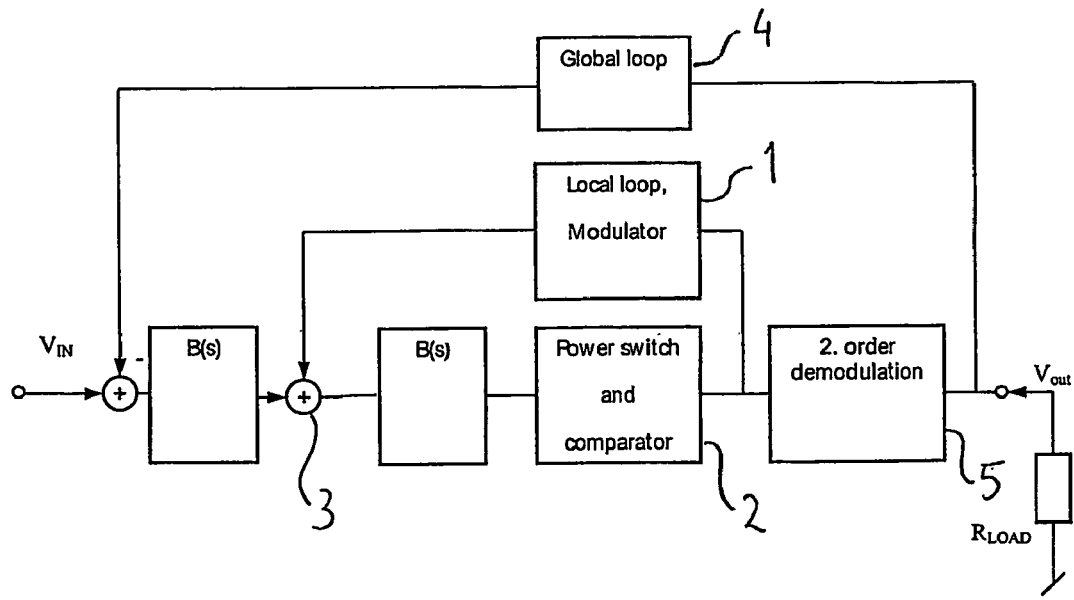
FIG. 1 illustrates a prior art multi-loop system with a non hysteresis modulator implemented in the local control loop.
Figure 2:
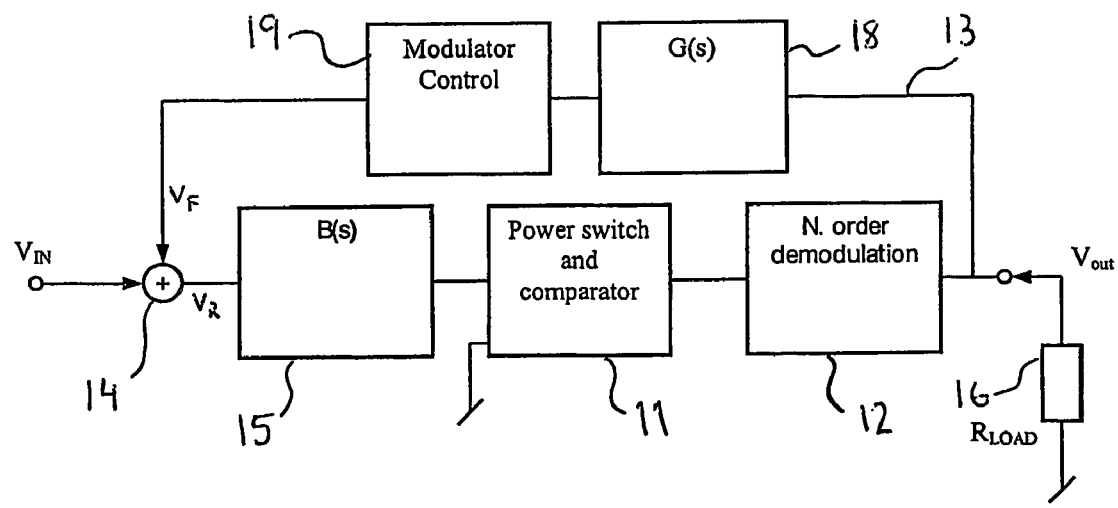
FIG. 2 illustrates a system according to a first embodiment of the invention.

A power conversion system comprising a modulator according to a first preferred embodiment of the invention is shown in FIG. 2. The system comprises a switching power stage 11, an output filter 12, and a global feedback path 13 feeding back the output of the output filter 12 to a summing point 14, arranged to subtract the feedback signal $V_F$ from an input signal $V_{in}$, and to supply the result $V_R$ to a forward block 15 preceding the switching stage 11. A load 16 is provided with the output from the output filter 12. For simplicity, the global feedback path 13 is illustrated with two feedback blocks 18, 19, but these may naturally be implemented as one block.

The power stage 11 can comprise one or a plurality of half-bridges, preferably a full-bridge comprising two half-bridges or a single half-bridge in single ended operation mode.

The output filter 12 is arranged to demodulate the switching output from the switching stage 11, and is typically a low pass filter of order N.

According to this embodiment of the invention, the feedback block 18 has a transfer function G(s) comprising at least N−1 zeroes placed near the filter cut-off frequency, $f_{cut-off}$, where $N \in [1; \infty]$ and where N is the order of the output filter 12. These zeroes will act to compensate for at least a portion of the output filter phase lag, so that the open global loop frequency characteristics at the most will have a N-(N−1)=1:st order low-pass behaviour.

Further, the feedback block 19 has a transfer function comprising two high frequency COM poles, with similar function as the COM poles mentioned in prior art. These poles cause an additional phase lag at the switching frequency of 180 degrees, thereby providing self oscillation. The oscillation can in the forward block 15 of the switching power converter be used as pulse width modulation means. In summary, a non-hysteresis modulator is implemented using the global loop (comprising the global feedback path 13 and the forward path 15, 11, 12) of the switching power converter.

Note that one or both of the COM poles may be placed in the forward block. In principle, the feedback block 19 may be reduced to a unity gain (i.e. eliminated).

The global feedback path 13 can be voltage controlled, as described in WO 98/19391 or current controlled as described in WO 02/25357, both hereby incorporated by reference.

The high frequency poles causing the self oscillation may equally well be time delays, if this is preferred. Also, a combination of time delays and poles may be advantageous.

Figure 3:
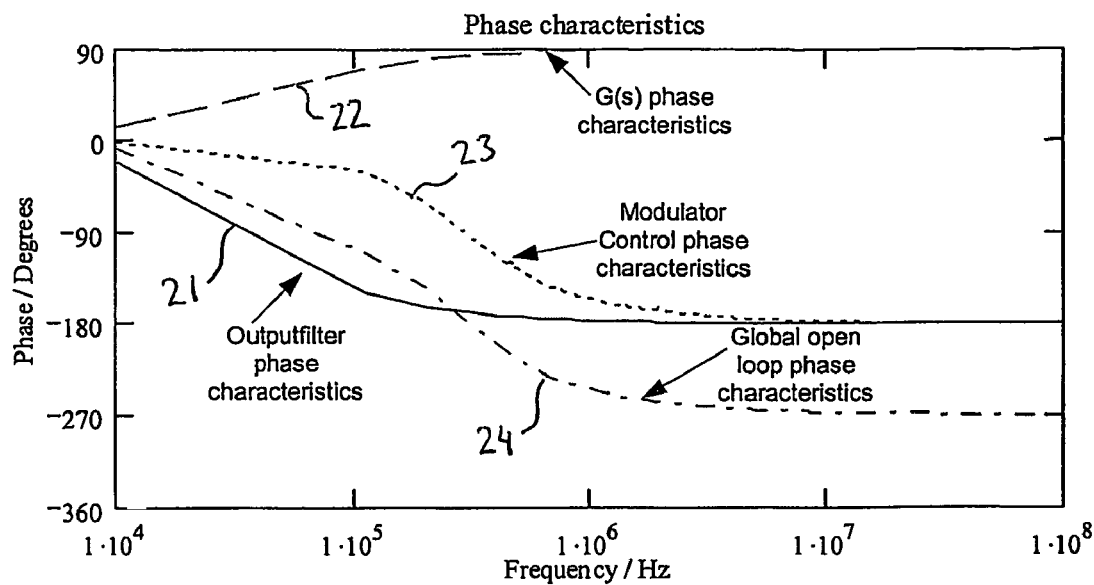
FIG. 3 illustrates the phase characteristics of an example of a system according to FIG. 2.

According to an example of the block diagram in FIG. 2, the output filter is of order 2, the feedback block 18 comprises one zero, preferably placed at the output filter pole frequency, and the two high frequency poles are implemented in the feedback block 19, here labelled "modulator control". The phase characteristics of this system is illustrated in FIG. 3. The curve 21 represents the output filter 12, having a high frequency phase lag of 180 degrees. The curve 22 represents the transfer function G(s) of feedback block 18, and has a positive phase-lag of 90 degrees. In other words, the bock 18 compensates one of the filter poles, to create a global open loop system with a high frequency phase lag of 90 degrees. To this system, the two high frequency COM poles of the modulator control 19, represented in the figure by curve 23, are added. The total global open loop system is represented by curve 24.

The implementation of the system in FIG. 3 will create an oscillation at approximately 300 kHz, where the open global loop has a phase lag of 180 degrees and the open global loop amplitude is above 0 dB. This oscillation frequency, referred to as the switching frequency, $f_{sw}$, will be equal to the cut-off frequency of the high frequency COM poles in the global loop. The self oscillation can be used in the forward path of the switching power converter as a PWM means.

The control system can have a small signal closed loop frequency characteristics with 100-200 kHz frequency bandwidth at −3 db gain depending on the loop shaping.

Figure 4:
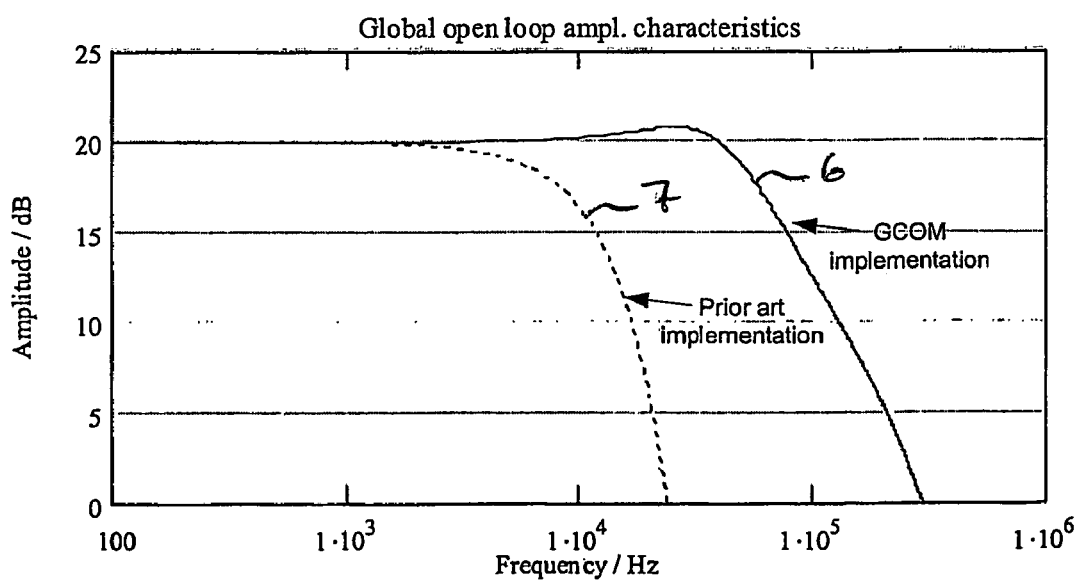
FIG. 4 illustrates the open global loop amplitude characteristics of a prior art system and a system according to FIG. 2.

Also, compared to prior art systems, a system according to the invention has wider bandwidth gain. FIG. 4 illustrates the global open loop amplitude characteristics of the example system described above (curve 6) compared to a conventional implementation (curve 7).

An additional pole can be inserted in the feedback block 18. This pole is preferably placed at a higher frequency than the zeros in the feedback block 18 mentioned above. Such a pole will reduce the gain bandwidth requirements of the global feedback blocks 18, 19 and reduce the necessary slewrate and gain bandwidth ratings on the operational amplifiers comprised in the feedback blocks 18, 19.

Figure 5:
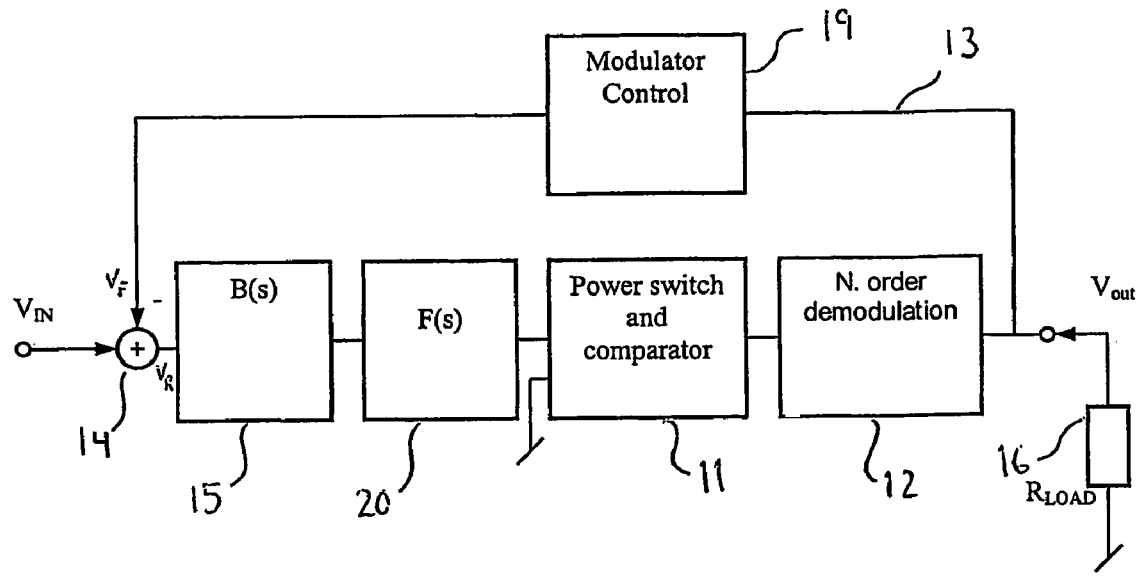
FIG. 5 illustrates a system according to a second embodiment of the invention.

A second embodiment is illustrated in FIG. 5, where similar elements have been given identical reference numerals as in FIG. 2. According to this embodiment, the feedback block 18 is eliminated, and instead an additional forward block 20 is inserted in the forward path. This forward block 20 has a transfer function F(s) comprising at least N−1 zeroes, thus achieving the required output filter pole cancellation. Again, the zeroes are preferably placed at the output filter pole frequency.

Of course, a combination of the feedback block 18 and forward block 20 is also possible, with a number of zeroes in each.

Figure 6:
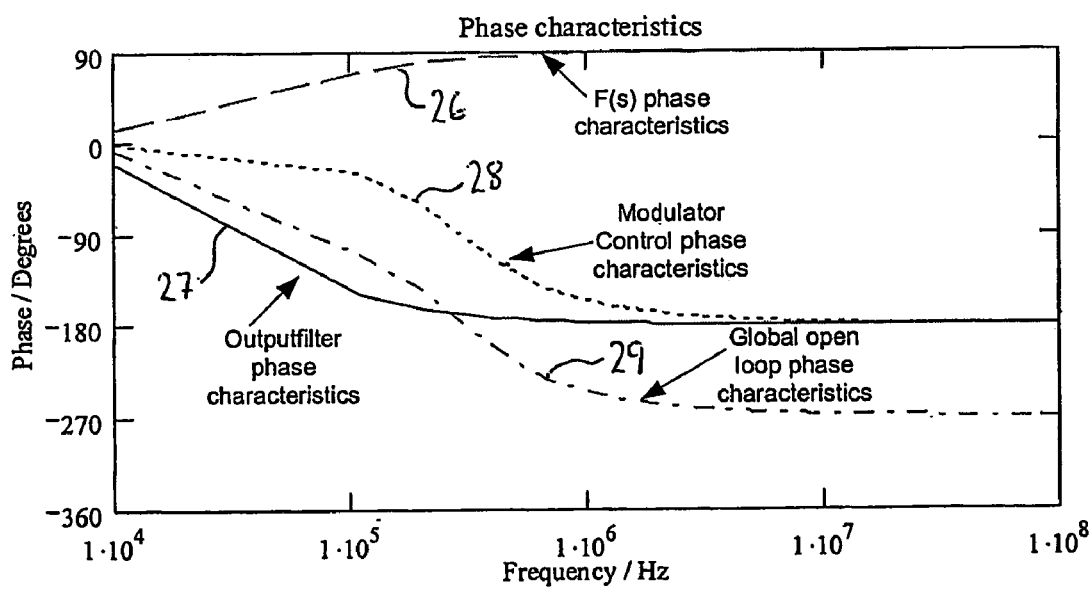
FIG. 6 illustrates the phase characteristics of an example of a system according to FIG. 5.

FIG. 6 illustrates the phase characteristics of an example of the system in FIG. 5, with N=2. As is clear from FIG. 5, the phase characteristics of F(s) (curve 26) resemble those of the G(s) curve in FIG. 3, thus again compensating one of the output filter poles (curve 27), and together with the feedback block (curve 28) forming a global open loop (curve 29) phase lag of 180 degrees at the switching frequency.

As in the system illustrated in FIG. 2, an additional pole can be inserted in the forward block 20. This pole is preferably placed at a higher frequency than the output filter pole frequency, thus limiting the gain requirements of the forward path of the switching power converter and reducing the necessary slewrate and gain bandwidth ratings on the operational amplifiers comprised in the forward path.

A third preferred embodiment of the invention is shown in FIG. 7, where again similar elements have been given identical numbers as in FIG. 2. In addition to the global path 13, the system in FIG. 7 comprises a local feedback path 30 with a feedback block 31, connected to the output of the switching power stage 11. The local feedback signal $V_{FL}$ is connected to a second summing point 32, dividing the forward block 15 in FIG. 2 into two blocks, 33 and 34.

According to this embodiment, the output filter pole/poles cancellation is obtained by providing the local feedback block 31 comprising at least N−1 poles preferably placed at the output filter cut-off frequency, $f_{cut-off}$, where again N is the order of the output filter 12.

The local closed loop transfer function can be described as:

$$H_{cl} = \frac{B(s)}{1 + B(s) \cdot L(s)}$$

where B(s) is the transfer function of the local forward block 33, and L(s) is the transfer function of the local loop feedback block 31.

In other words, a pole in the local feedback block 31 will have the effect of a zero in the global open loop system, and will thus act to compensate the poles in the output filter 12.

Figure 7:
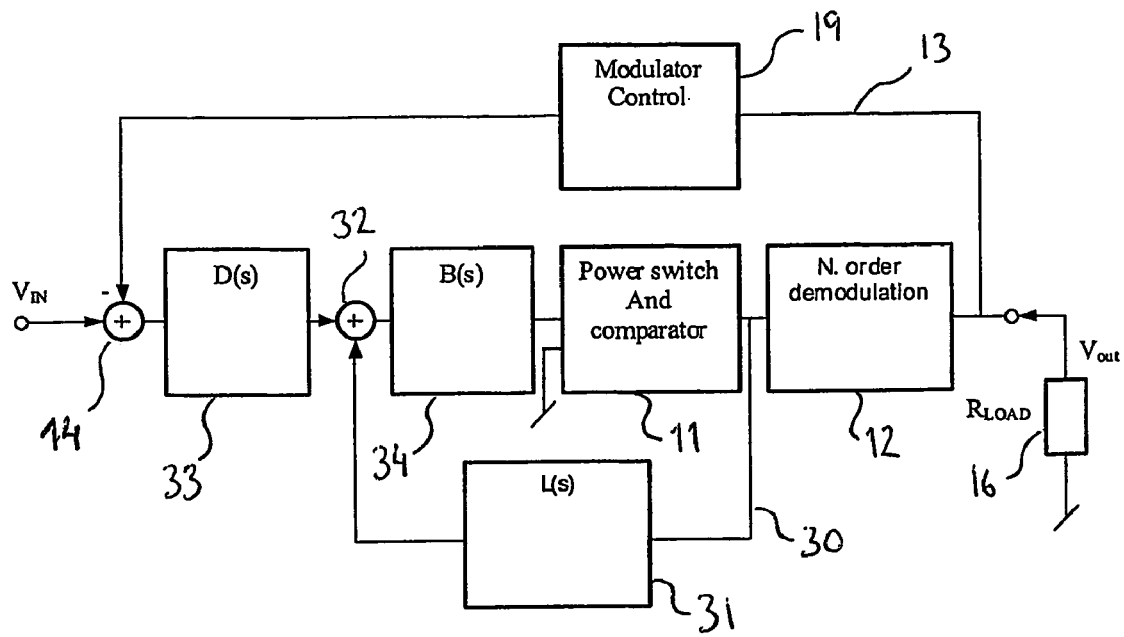
FIG. 7 illustrates a system according to a third embodiment of the invention.
Figure 8:
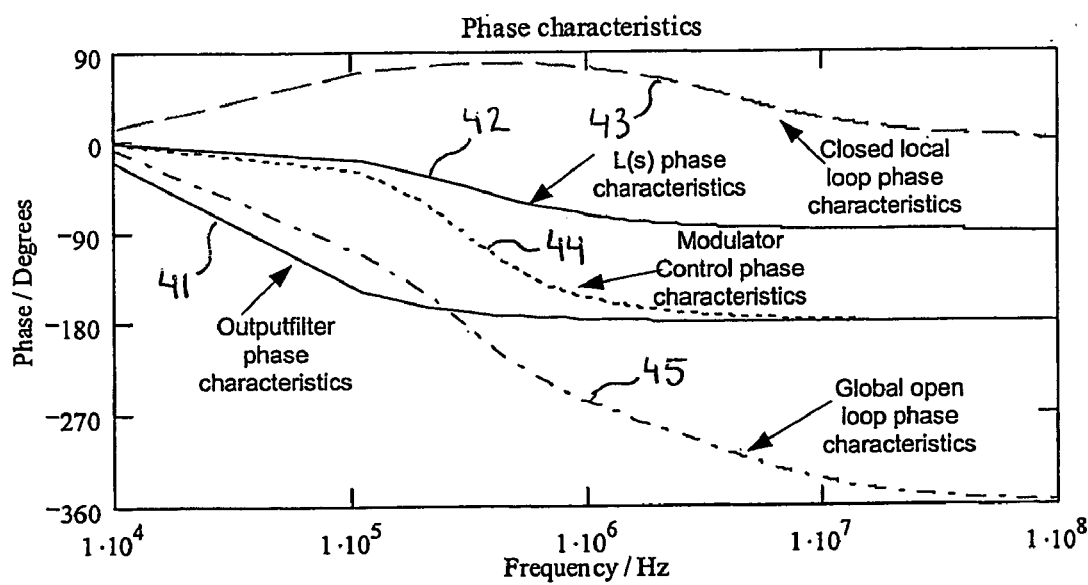
FIG. 8 illustrates the phase characteristics of an example of a system according to FIG. 7.

The phase characteristics of a specific implementation of the block diagram in FIG. 7 is shown in FIG. 8. In this example, the system comprises a 2:nd order output filter 12 (N=2) creating a high frequency phase lag of 180 degrees (curve 41). The local feedback block 31 includes one pole at the filter cut-off frequency, $f_{cut-off}$, (curve 42) and when the local loop is closed this pole will have the effect of a positive phase-lag of 90 degrees (curve 43) to the open global loop system. The modulator control phase lag is again implemented as two high frequency poles in the global feedback block 19, and its phase characteristics (curve 44) is the same as in FIG. 3. In total, the global open loop system is represented by curve 45.

The implementation of the system as shown in FIG. 8 will create an oscillation at approximately 300 kHz where the open global loop has a phase lag of 180 degrees and the open global loop amplitude is above 0 dB. This self oscillation can be used in the forward path of the switching power converter as PWM means.

Figure 9:
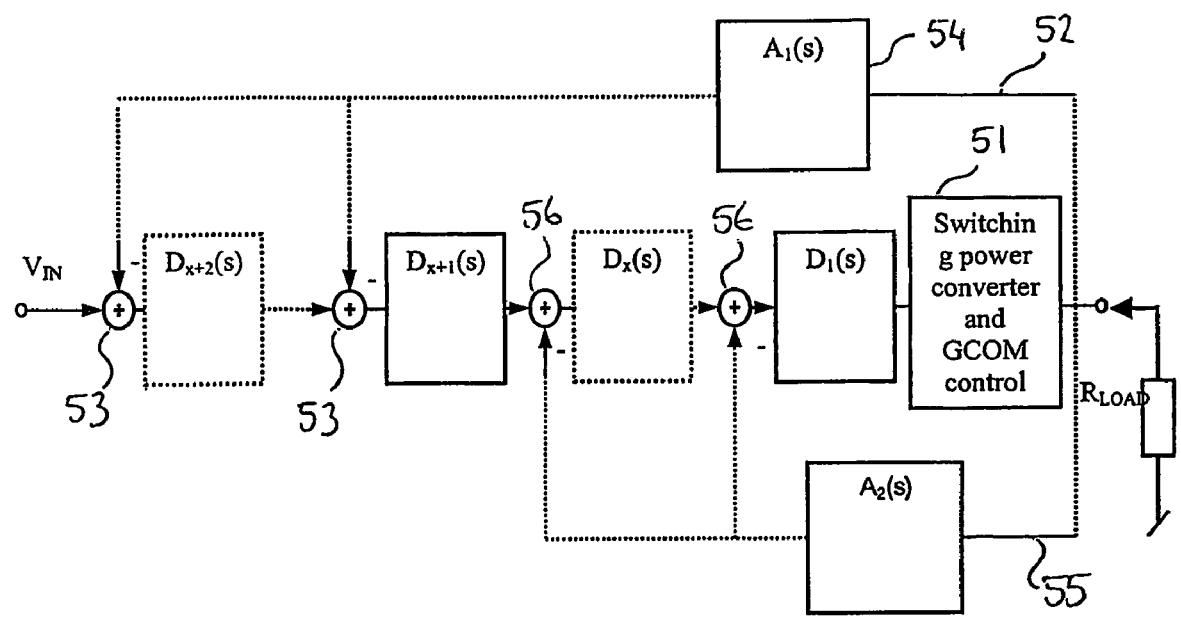
FIG. 9 illustrates a system according to a fourth embodiment of the invention.

A fourth preferred embodiment of the invention is shown in FIG. 9. In this figure, the elements of FIG. 2 are all comprised in the block 51, i.e. a switching power converter with GCOM control. In addition to the GCOM control, the system in FIG. 8 comprises an additional global voltage loop 52 that feeds the output of the switching power converter (i.e. the demodulated output from the output filter) back to at least one summation point 53 preceding the power converter 51. If the output filter pole compensation is obtained in the global feedback loop as described above, the additional global voltage loop can preferably comprise at least N−1 zeroes in a feedback block 54.

Yet another global voltage loop 55 can be cascaded with the loop 52, so that the output signal of the switching power converter 51 is be fed back to several summation points 53, 56 preceding the switching power converter 51.

Naturally, the additional loops can be shaped in many different ways, considered advantageous by the skilled person. The switching power converter 51 can be implemented as shown in any other preferred embodiments.

It is clear that the skilled person my make modifications to the above described preferred embodiments without departing from the inventive concept. For example, additional poles and zeroes may be placed in the global and/or local loop in order to further improve the shaping of the phase characteristics. Such poles and zeroes may preferably be placed at a frequency higher than the cut-off frequency of the output filter.

The invention claimed is:

1. A pulse modulation power converter comprising:
   a forward path including a forward block, a switching stage for amplifying an output from the forward block, and an output filter for low pass filtering an output signal from the switching stage, a global feedback path, connected to the low pass filtered output signal, comprising a global feedback block for generating a feedback signal, means for subtracting said feedback signal from an input signal, and feeding the result to said forward path, wherein said global feedback block and/or forward block includes:

means for compensating at least a portion of a phase lag of said output filter, and means for obtaining a 180 degrees phase lag at a switching frequency, thereby achieving conditions for a controlled oscillation at said switching frequency.

2. A converter according to claim 1, wherein said compensation means include at least N−1 zeroes placed near the output filter cut-off frequency, where N is equal to the order of the output filter.

3. A converter according to claim 2, wherein said compensation means include at least one zero placed at a higher frequency than the output filter cut-off frequency.

4. A converter according to claim 1, wherein said means for obtaining a 180 degrees phase lag at the switching frequency comprises at least one high frequency pole.

5. A converter according to claim 1, wherein said means for obtaining a 180 degrees phase lag at the switching frequency comprises at least one time delay.

6. A converter according to claim 1, further comprising at least one local feedback path from the output of the switching power stage to at least one summation point in the forward path, said local feedback path comprising a local feedback block.

7. A converter according to claim 6, wherein said compensation means include at least one pole near the output filter cut-off frequency placed in the local feedback block.

8. A converter according to claim 1, further comprising at least one additional global feedback path, connected to the output signal of the output filter and to a summing point preceding the forward block.

9. A converter according to claim 1 implemented in a power conversion system such as AC-DC, DC-AC, DC-DC or any combination of the above mentioned, especially DC-AC converters for audio use and transmission line drivers.

* * * * *